United States Patent [19]
Takahashi et al.

[11] Patent Number: 5,903,239
[45] Date of Patent: *May 11, 1999

[54] MICRO-PATCH ANTENNA CONNECTED TO CIRCUITS CHIPS

[75] Inventors: Kazuaki Takahashi, Kawasaki; Suguru Fujita; Morikazu Sagawa, both of Tokyo, all of Japan

[73] Assignee: Matsushita Electric Industrial Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/451,813

[22] Filed: May 26, 1995

[30] Foreign Application Priority Data

Aug. 11, 1994 [JP] Japan ..................................... 6-189494

[51] Int. Cl.⁶ ........................... H01Q 23/00; H01Q 13/08
[52] U.S. Cl. .................................. 343/700 MS; 343/853; 333/247
[58] Field of Search ............................ 393/700 MS, 853; 333/247; H01Q 23/00, 13/08, 1/38

[56] References Cited

U.S. PATENT DOCUMENTS

| | | | |
|---|---|---|---|
| 4,736,454 | 4/1988 | Hirsch | 343/700 MS X |
| 4,987,425 | 1/1991 | Zahn et al. | 343/853 |
| 5,185,613 | 2/1993 | Whatmore et al. | 343/909 |
| 5,386,214 | 1/1995 | Sugawara | 343/700 MS |
| 5,400,039 | 3/1995 | Araki et al. | 343/700 MS |
| 5,438,697 | 8/1995 | Fowler et al. | 333/247 X |
| 5,448,249 | 9/1995 | Kushihi et al. | 343/700 MS |
| 5,510,758 | 4/1996 | Fujita et al. | 333/247 |

FOREIGN PATENT DOCUMENTS

| | | | |
|---|---|---|---|
| 4020109 | 1/1992 | Japan | H01Q 23/00 |
| 4068703 | 3/1992 | Japan | 333/247 |
| 5167332 | 7/1993 | Japan | H01Q 13/08 |
| 5-218736 | 8/1993 | Japan . | |
| 6029211 | 7/1994 | Japan | H01Q 13/08 |

*Primary Examiner*—Benny T Lee
*Attorney, Agent, or Firm*—Rossi & Associates

[57] ABSTRACT

An antenna apparatus comprises: a first chip having: a substrate; a ground film on the substrate; a dielectric film on the ground film; a micro-patch antenna on the dielectric film; a microstrip line extending from the micro-patch antenna; and an in/output microstrip line on the dielectric film; a second chip having a circuit for effecting an operation with the antenna; and a connecting portion for fixing the second chip to the first chip by providing mechanical and electrical connection (flip-chip bonding) between the circuit and the microstrip line and between the circuit and the in/output microstrip line. The substrate comprises a silicon, a GaAs substrate, or a dielectric substrate. The antenna may be provided on the bottom surface of the substrate and be provided on a third substrate also connected by the flip-chip bonding wherein the second chip and the antenna is connected using a through hole. Instead of the through hole, the antenna is coupled to the circuit portion electromagnetically. The substrate may have a hollow portion and the second chip may be accommodated in the hollow portion and the antenna may be provided on a third chip covering the second chip.

27 Claims, 11 Drawing Sheets

MICRO-PATCH ANTENNA CONNECTED TO CIRCUITS CHIPS

BACKGROUND OF THE INVENTION

1. Field of the Invention

This invention relates to an antenna apparatus for receiving or transmitting radiowaves.

2. Description of the Prior Art

An antenna apparatus, having a microstrip patch antenna on a first substrate for receiving or transmitting radiowaves and a radiowave circuit on a second substrate for receiving or a radiowave signal from the microstrip patch antenna or supplying a radiowave signal to the microstrip patch antenna, first and second substrates being combined to provide a hybrid structure or a monolithic structure to reduce a loss in the coupling pass between the microstrip patch antenna and the radiowave circuit, is known.

FIG. 12 is a perspective view of a prior art monolithic antenna apparatus. A first chip having a microstrip antenna 202 formed on a bottom surface of a quartz substrate 201 and a ground conductor 203, having a slot 204 or a window, formed on a top surface of the substrate 201. A second chip comprising an MMIC 205 having a GaAs substrate and a down-converter 206, and a microstrip line 207 for coupling to the microstrip patch antenna 202. First and second chips are bonded such that the microstrip patch antenna 202 is coupled to the microstrip line 207 through the slot 204 by electromagnetic coupling. This is disclosed in a paper Published in Volume 2, at c-50 of the autumn meeting 1992 of The Institute of Electronics, Information and Communication Engineers.

SUMMARY OF THE INVENTION

The aim of the present invention is to provide an improved antenna apparatus.

An antenna apparatus comprises: a first chip having: a substrate; a ground film on the substrate; a dielectric film on the ground film; a micro-patch antenna on the dielectric film; an interconnection microstrip line, on the dielectric film, extending from the micro-patch antenna; and an input/output microstrip line on the dielectric film at a predetermined position; a second chip having a circuit, including input and output terminals on a surface of the second chip, for effecting a predetermined operation with the micro-patch antenna; and a connecting portion, including bumps, for fixing the second chip to the substrate by providing mechanical and electrical connection (flip-chip bonding) between the circuit and the interconnection microstrip line and between the circuit and the input/output microstrip line through the input and output terminals and the bumps. The substrate comprises a silicon, a GaAs substrate, or a dielectric substrate. The antenna may be provided on the bottom surface of the first chip connected to the microstrip line on the top surface of the first chip by a through hole in the substrate. Instead of the through hole, a coupling microstrip line on the dielectric film of the first chip connected to the circuit portion is electromagnetically coupled to the antenna. The coupling microstrip line may be provided on a bottom surface of the second chip.

The antenna may be provided on an antenna chip also connected to microstrip line by the flip-chip bonding wherein the second chip and the antenna is connected using a through hole in the antenna chip.

The substrate may have a hollow portion and the second chip may be accommodated in the hollow portion and the antenna may be provided on a third chip covering the second chip.

According to the above-mentioned structures, the second chip having at least active circuit such as a detection circuit or a signal generation circuit using a expansive GaAs substrate has a small area as compared to the antenna which has a relatively larger area formed on a relative low cost silicon substrate or the like. Therefore, a total cost is reduced. Moreover, an area of the second chip is small, so that its yield is larger than the circuit portion would be manufactured with the microstrip patch antenna in the same chip. Further, respective chips are manufactured by respective chip manufacturing process steps, so that accuracy in patterning of respective chips which are important in the millimeter wave band are high. Moreover, these chips are fixed and electrically connected by the flip-chip bonding, so that an accuracy in mounting of chips is high. Therefore, the antenna apparatus of this invention can be mass produced easily. Further, a plurality of circuit chips may be fixed to the antenna chip by providing mechanical and electrical connections between the microstrip patch antenna and the active circuit of at least one of the plurality of circuit chips, mechanical and electrical connections between the active circuits of the plurality of circuit chips, and a mechanical and electrical connection between at least one of the plurality of circuit chips and the input/output microstrip line through bumps (masses of solder or gold), wherein the active circuits of the plurality of circuit chips comprise semiconductor elements having at least two different kinds of semiconductor structures (HEMT, MESFET, HBT, diode, or the like).

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Figure 1:
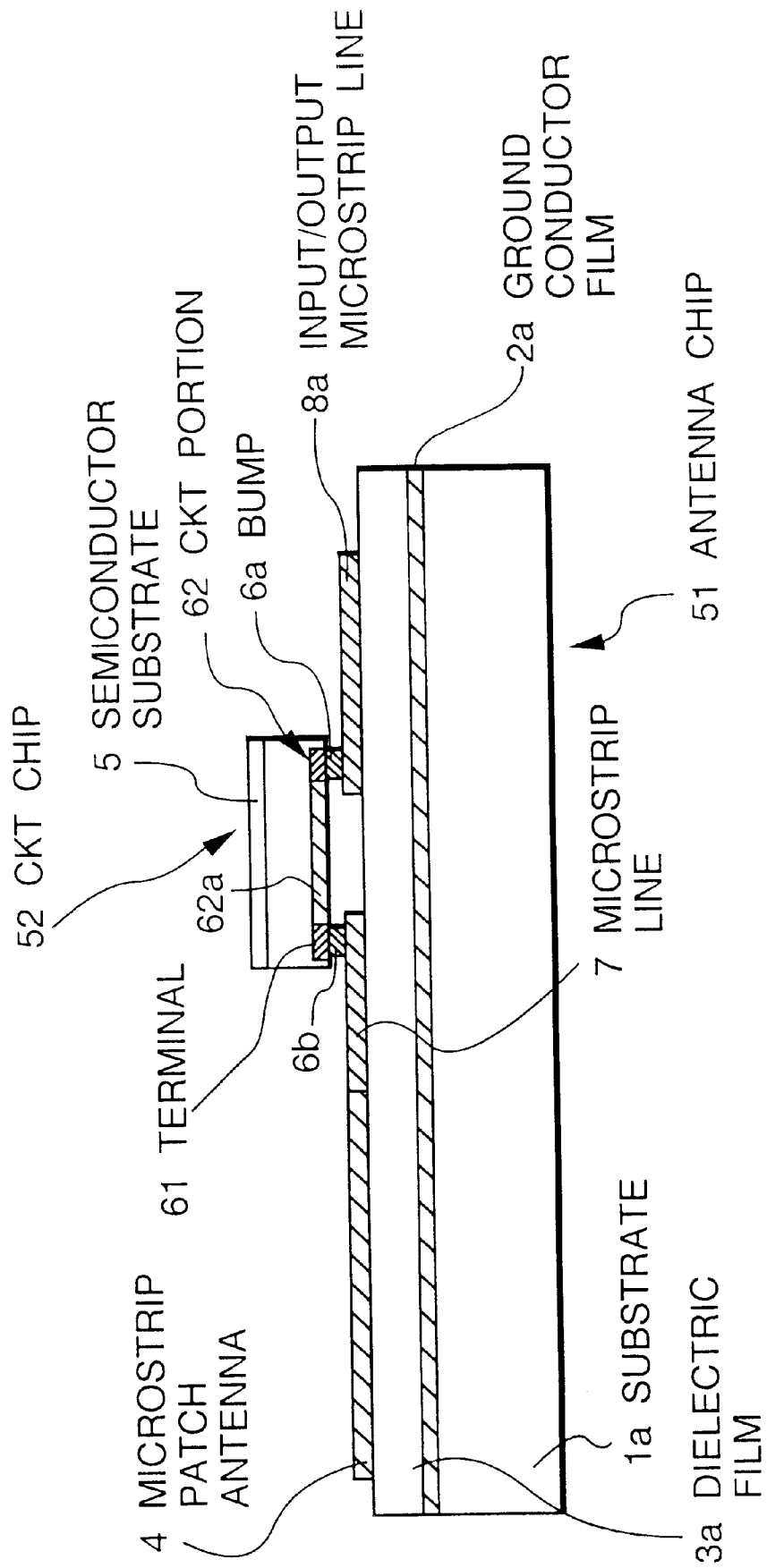
FIG. 1 is a cross-sectional view of a first embodiment of an antenna apparatus.
Figure 2:
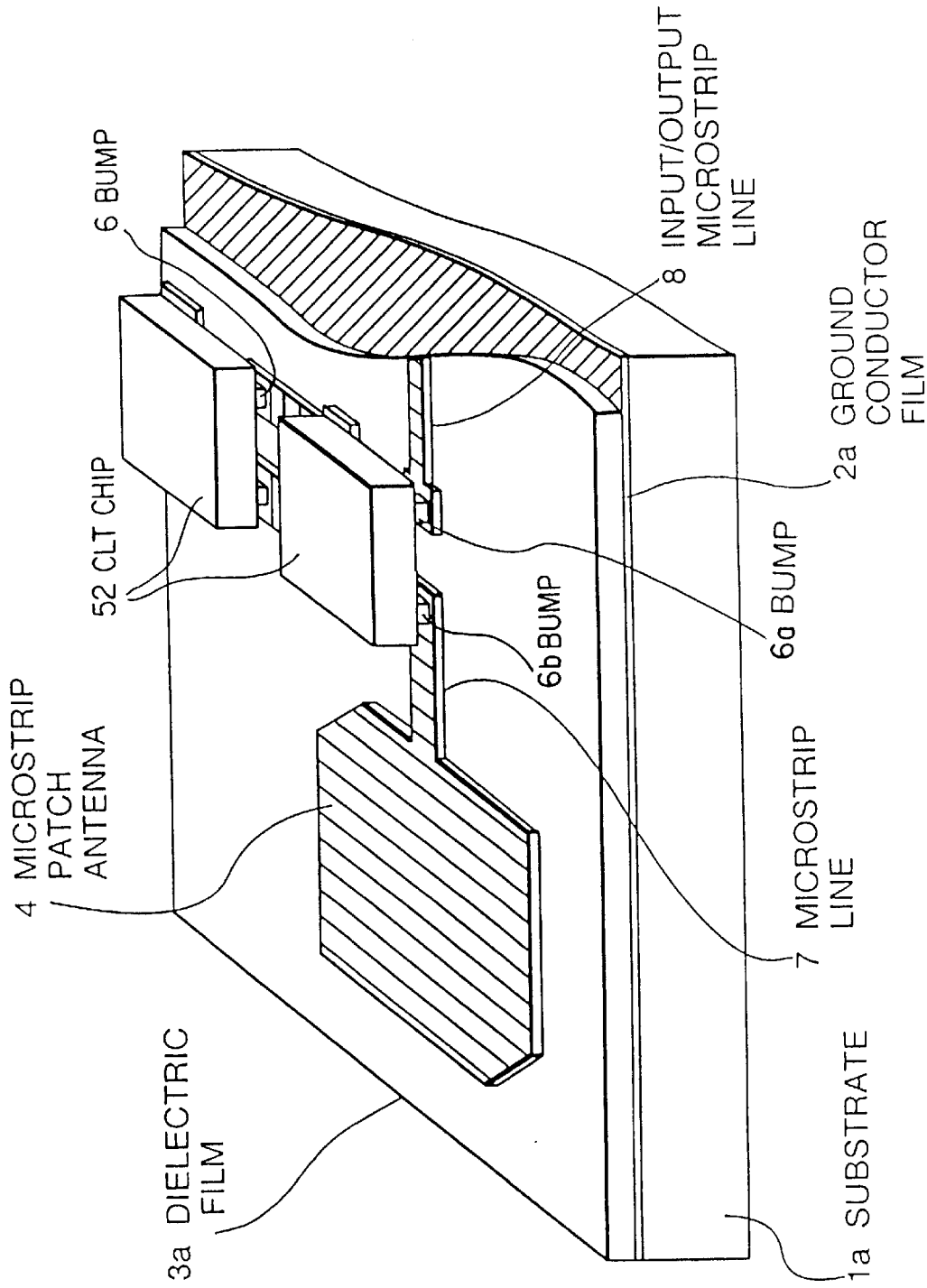
FIG. 2 is a perspective view of the first embodiment.

Hereinbelow will be described a first embodiment of this invention. FIG. 1 is a cross-sectional view of the first embodiment of an antenna apparatus. FIG. 2 is a perspective view of the first embodiment.

In FIGS. 1 and 2, the antenna apparatus comprises an antenna chip 51 and one or more circuit chips 52 (See FIG. 2) which are flip-chip bonded using bumps 6. The antenna chip 51 comprises a substrate 1a, a ground conductor film 2a on the substrate 1a, a dielectric film 3a on the ground conductor film 2a, a first microstrip patch antenna 4 on the dielectric film 3a, a microstrip line 7, connected to the microstrip patch antenna 4, on the dielectric film 3a, and an input/output microstrip line 8a on the dielectric film 3a.

As best seen in FIG. 1, the circuit chip 52 comprises a semiconductor substrate 5, a circuit portion 62 including a detecting circuit having a Schootky barrier diode, and a terminals 61 on a surface of the circuit chip 52. The bumps 6a and 6b provide connections between the detecting circuit and the microstrip line 7 and between the detecting circuit and the input/output microstrip line 8a through the terminals 61. he microstrip line 7 and the input/output microstrip line are arranged at predetermined position in order to bond he antenna chip 51 and the circuit chip 52.

The circuit chip in a bare chip condition is fixed to the input/output microstrip line 8a and the microstrip line 7 through the bumps 6a and 6b respectively by the flip-chip bonding method and other pads formed on the antenna chip 51 and the circuit chip 52 are also used for bonding the antenna chip 51 and the circuit chip 52.

Radiowaves received by the microstrip patch antenna 4 is supplied to the detecting circuit 62a (active circuit) in the circuit chip 52. The detection output signal of the detection circuit is outputted by the input/output microstrip line 8a.

As mentioned above, the antenna 4 is electrically connected to the detection circuit in the circuit chip 52 by the flip-chip bonding method and the circuit chip is fixed to the antenna chip 51 through the bumps 6a and 6b and terminals 61 connected to the detection circuits, so that a loss which frequently occurs around bonding wires can be reduced because there is few stray reactances around the bonding path. Therefore, a high sensitive detector of millimeter band is provided. This structure is also applicable to an antenna apparatus for transmitting radiowaves. In that case, the input/output microstrip line 8a supplies a transmission signal to the circuit portion 52. The circuit portion 52 supplies a radio frequency signal from the transmission signal to the microstrip patch antenna 4.

The substrate 1 comprises a silicon substrate. Therefore, a cost for the substrate 1 is relatively low, although the first antenna 4 has a relative large area. On the other hand, the semiconductor substrate 5 made of GaAs has a small size, so that a cost of the circuit chip 52 is kept low. Therefore, a total cost is low with a high sensitivity. The substrate 1 may comprise a GaAs substrate.

The first substrate is manufactured by general silicon processing. Therefore, the first antenna 4 and the microstrip line 7 are made accurately in the order of 1 µm, which is important in the millimeter band monolithic antenna apparatus.

In this embodiment, the substrate 1a comprises the semiconductor substrate, i.e., the silicon substrate or a GaAs substrate. However, a dielectric substrate can be used for the substrate 1. The dielectric film 3a comprises a silicon dioxide ($SiO_2$) film.

Figure 3:
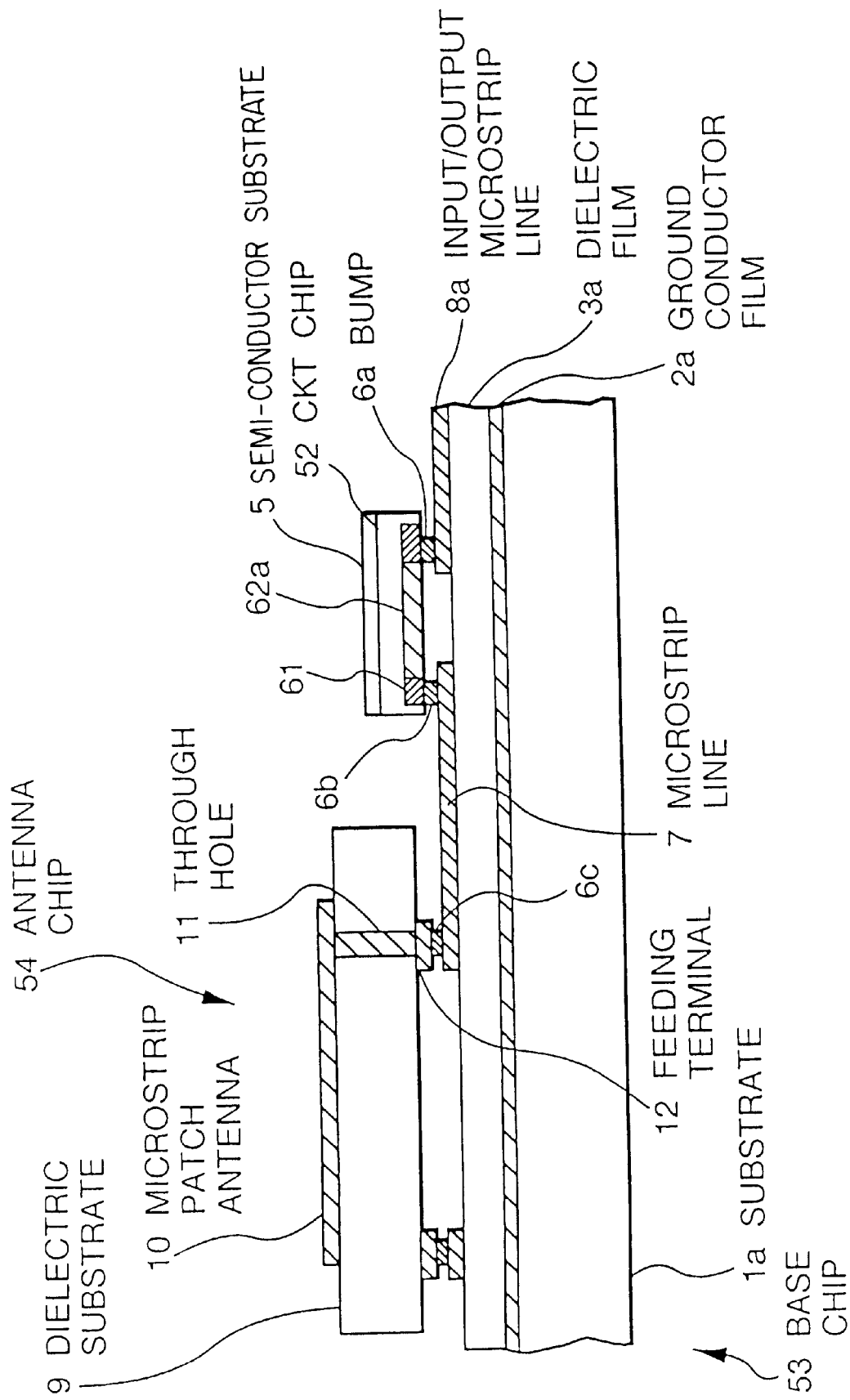
FIG. 3 is a cross-sectional view of a second embodiment of an antenna apparatus.

A second embodiment will be described. FIG. 3 is a cross-sectional view of a second embodiment of an antenna apparatus.

In FIG. 3, the structure of the second embodiment is similar to that of the first embodiment. The difference is in that a microstrip patch antenna 10 is provided in place of the microstrip patch antenna 4 and is provided on a separate chip, namely, an antenna chip 54 fixed on a base chip 53. The antenna chip 54 comprises the microstrip patch antenna 10 on a top surface of a dielectric substrate 9, a feeding terminal 12 formed on a bottom surface of the dielectric substrate 9, a through hole 11 formed in the dielectric substrate 9 to connect the microstrip patch antenna 10 to the feeding terminal 12. The feeding terminal 12 is connected to the microstrip line 7 on the base chip 53 through a bump 6c by the flip-chip bonding. The base chip 53 comprises the substrate 1a, the ground conductor film 2a on the substrate 1a, the dielectric film 3a on the ground conductor film 2a, the microstrip line 7, connected to the microstrip patch antenna 4, on the dielectric film 3a, and the input/output microstrip line 8a on the dielectric film 3a. The microstrip line 7 and the input/output microstrip line 8a are arranged at predetermined positions to mount the antenna chip 54 and the circuit chip 52.

Radiowaves received by the microstrip patch antenna 10 is supplied to the detecting circuit in the circuit chip 52 through the through hole 11, the feeding terminal 12, the bump 6c, the microstrip line 7, the bump 6b under the second semiconductor substrate 5. The detection output signal of the detection circuit is outputted at the input/output microstrip line 8a.

This structure of the second embodiment provides a larger interval between the microstrip patch antenna 10 and the ground conductor 2a. Therefore, a radiation efficiency of the antenna 10 is made high and thus, a high sensitivity is provided.

In this embodiment, the antenna chip 54 having the microstrip patch antenna 10 is provided separately. However, it is also possible to provide an oscillator or a receiver formed on a separate chip having a resonator or a filter similarly if a low loss is required. Such a separate chip also mounted on the base chip 53.

In the first and second embodiments, the substrate 1a is made of silicon. However, it is also possible to form the substrate 1 by a dielectric substrate such as a ceramic substrate or a glass substrate.

Figure 4:
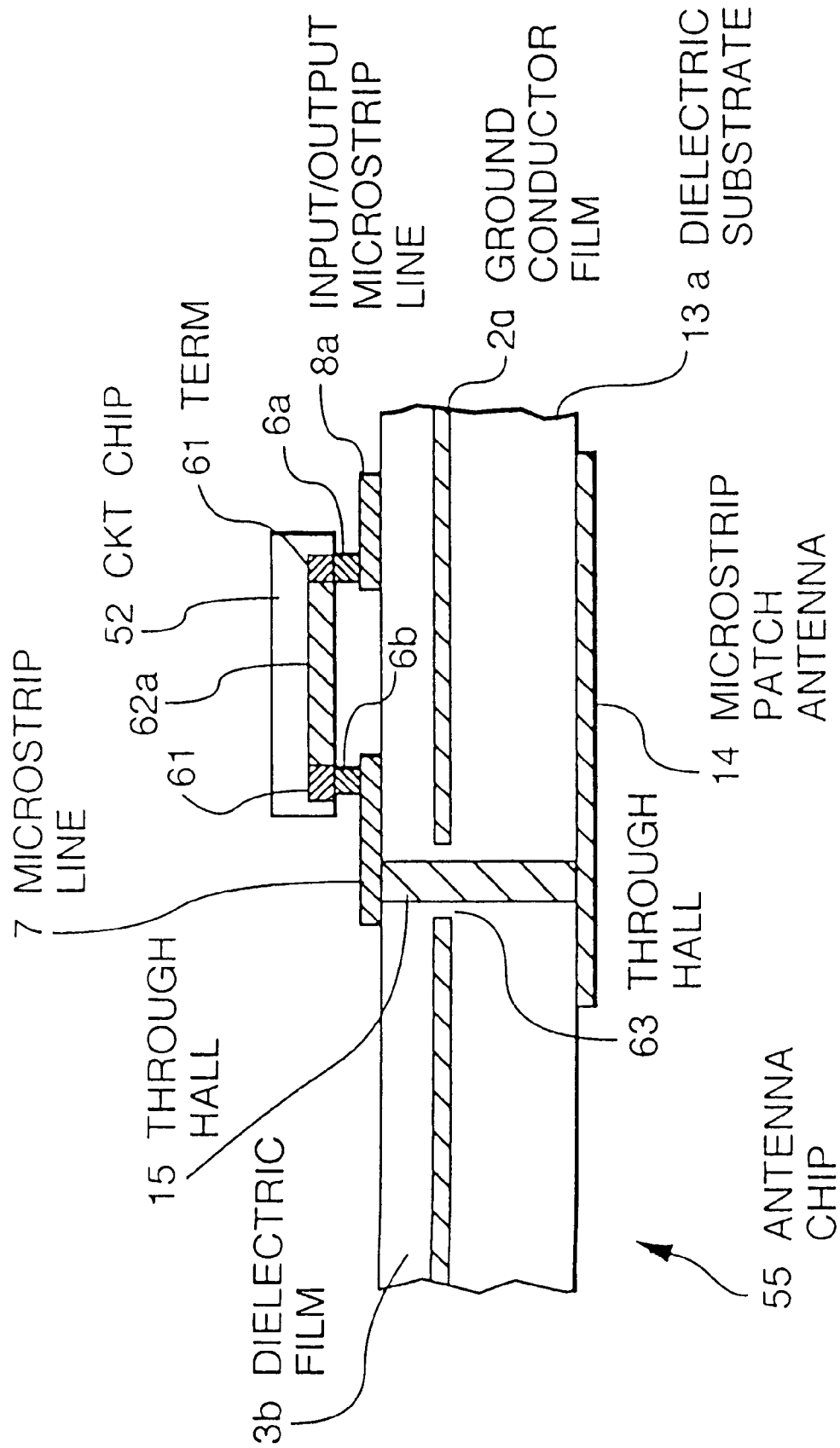
FIG. 4 is a cross-sectional view of a third embodiment of an antenna apparatus.
Figure 5:
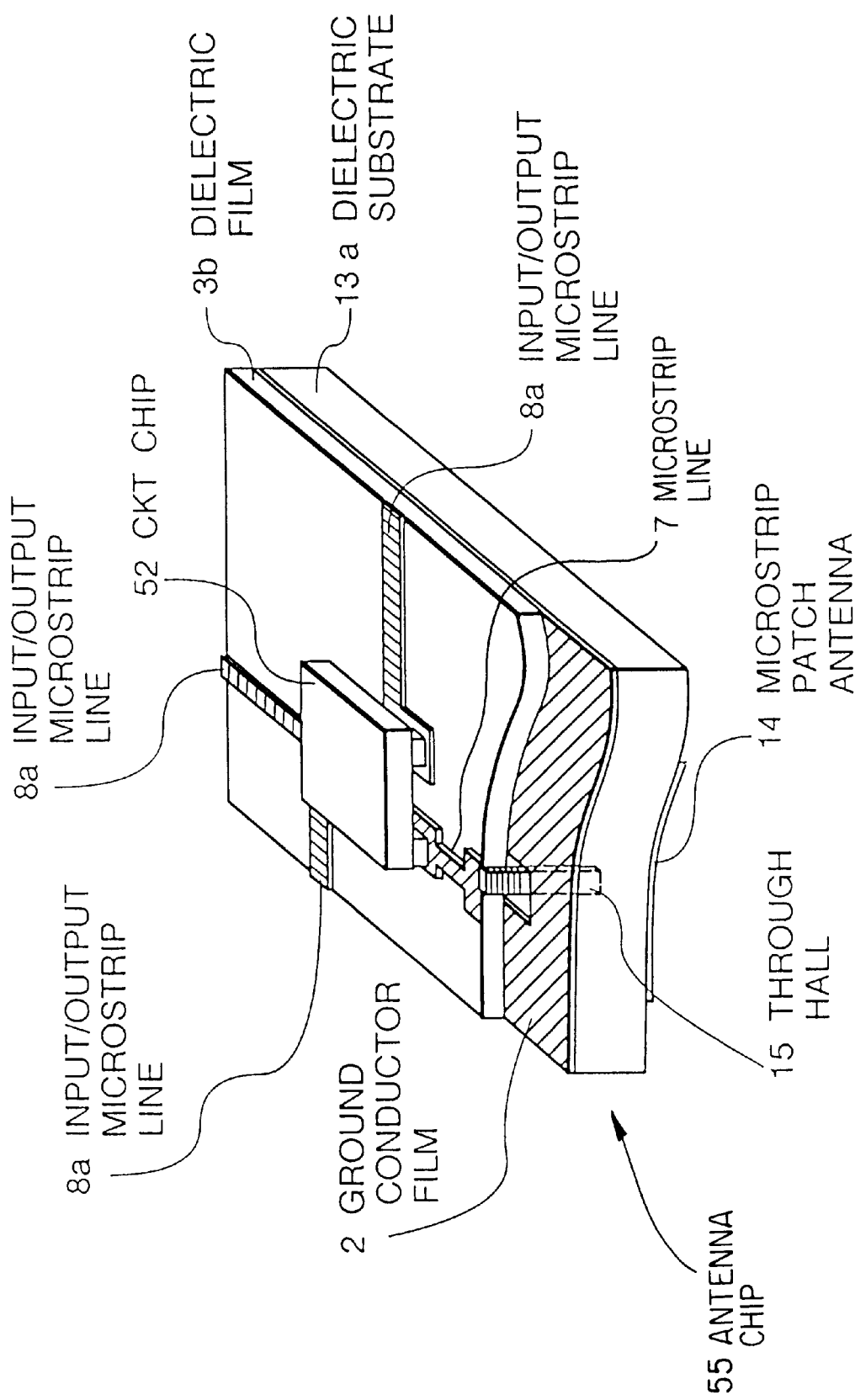
FIG. 5 is a perspective view of the third embodiment of an antenna apparatus.

A third embodiment will be described. FIG. 4 is a cross-sectional view of the third embodiment of an antenna apparatus. FIG. 5 is a perspective view of the third embodiment of an antenna apparatus.

In FIGS. 4 and 5, the structure of the third embodiment is similar to that of the first embodiment. The difference is in that an antenna chip 55 is provided in place of the antenna chip 51 and a microstrip patch antenna 14 is provided on a bottom surface of the second base chip in place of the microstrip patch antenna 4 which is formed on the top circuit of the antenna chip 51. The antenna chip 55 comprises a dielectric substrate 13, a ground conductor film 2a having a through hole on the second dielectric substrate 13, a dielectric film 3b, the microstrip line 7 on the dielectric film 3b, and a through hole 15 provided in the antenna chip between the microstrip line 7 and the microstrip patch antenna 14 for electrically connecting the microstrip patch antenna 14 to the microstrip line 7. The circuit chip 52 is provided as similar to the first embodiment. A diameter of the through hole 63 is larger than that of the through hole 15 and the through hole 63 and the through hole 15 are arranged coaxially. Therefore, a dielectric substance which is the same as the dielectric film 3b is filled between the through hole 15 and the through hole 63, so that the through hole 15, the microstrip line 7, and the antenna chip 55 are electrically insulated from the ground conductor film 2a.

Radiowaves received by the microstrip patch antenna 14 is supplied to the detecting circuit in the circuit chip 52 through the through hole 15, the microstrip line 7, the bump 6b (See FIG. 3) under the second semiconductor substrate 5. The detection output signal of the detection circuit is outputted by the input/output microstrip line 8a.

This structure of the third embodiment reduces an affection of a radiation pattern of the microstrip patch antenna 14 to the circuit portion in the circuit chip 52 because the microstrip patch antenna 14 is formed on the. different plane than the circuit chip 52. Moreover, this structure provides a miniaturization of the antenna apparatus because the microstrip patch antenna 14 is provided under the second semiconductor substrate 5.

Figure 6:
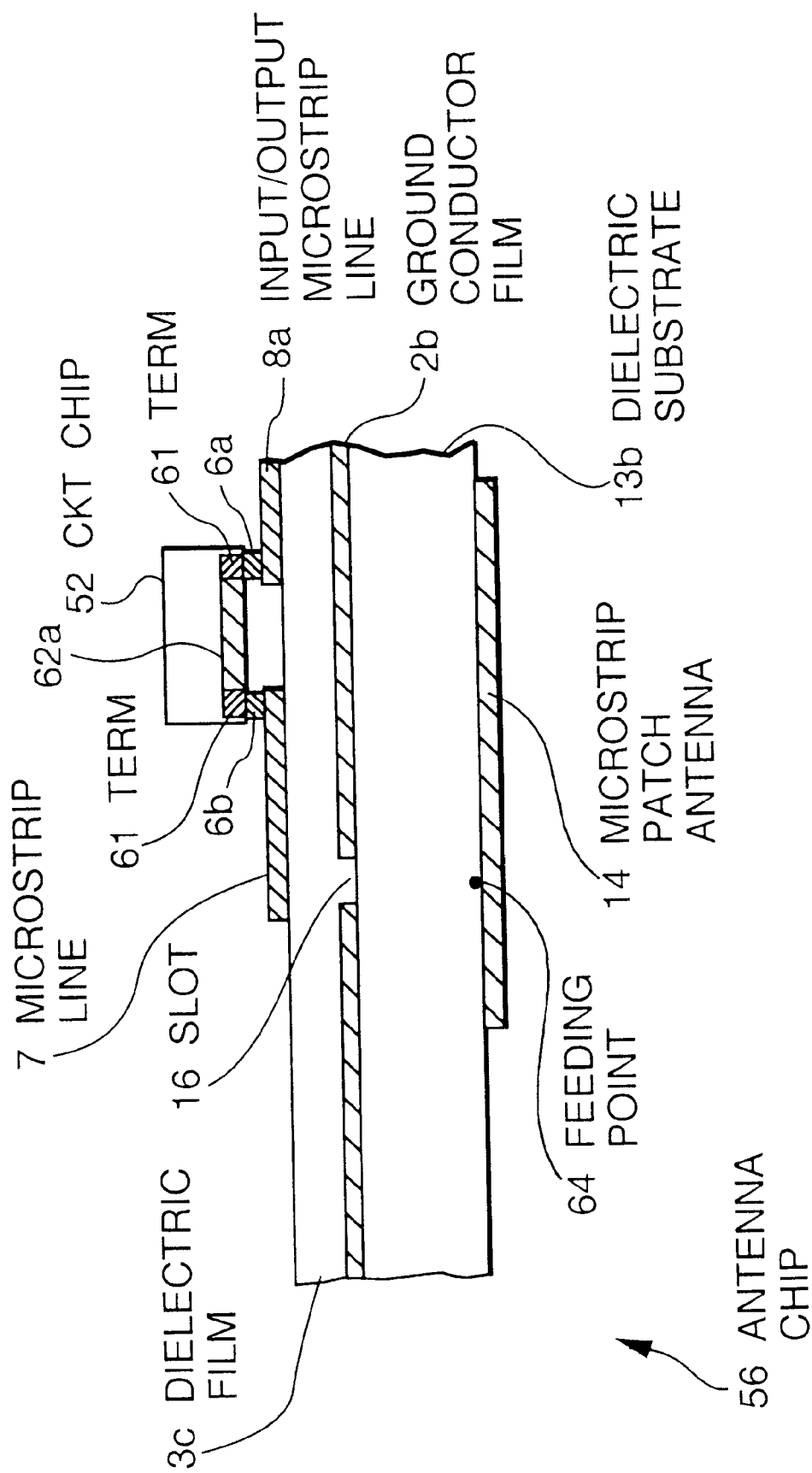
FIG. 6 is a cross-sectional view of a fourth embodiment of an antenna apparatus.

A fourth embodiment will be described. FIG. 6 is a cross-sectional view of the fourth embodiment of an antenna. apparatus.

In FIG. 6, the structure of the fourth embodiment is similar to that of the third embodiment. The difference is in that a an antenna chip 56 is provided in place of the antenna chip 55. The antenna chip 56 comprises a dielectric substrate 13b, a ground conductor film 2b having a slot 16, namely, a through hole, on the dielectric substrate 13b, a dielectric film 3c on the ground conductor film 2b, and the microstrip line 7 on the dielectric film 3c. The circuit chip 52 is provided as similar to the first embodiment. The microstrip line 7, the slot 16, and the third microstrip patch antenna 14 are arranged such that the microstrip line 7 and a feeding point 64 of the microstrip patch antenna 14 are coupled through the second dielectric substrate 13b, the slot 16, and the dielectric film 3c. In the slot 16, a dielectric substance which is the same as the dielectric film 3c is filled.

Radiowaves received by the microstrip patch antenna 14 is supplied to the detecting circuit in the circuit chip 52 through the dielectric substrate 13b, the slot 16 and the dielectric film 3c, the microstrip line 7, the bump 6a. The detection output signal of the detection circuit is outputted by the input/output microstrip line 8a.

This structure of the fourth embodiment eliminates a processing producing the through hole 15 of the third embodiment.

Figure 7:
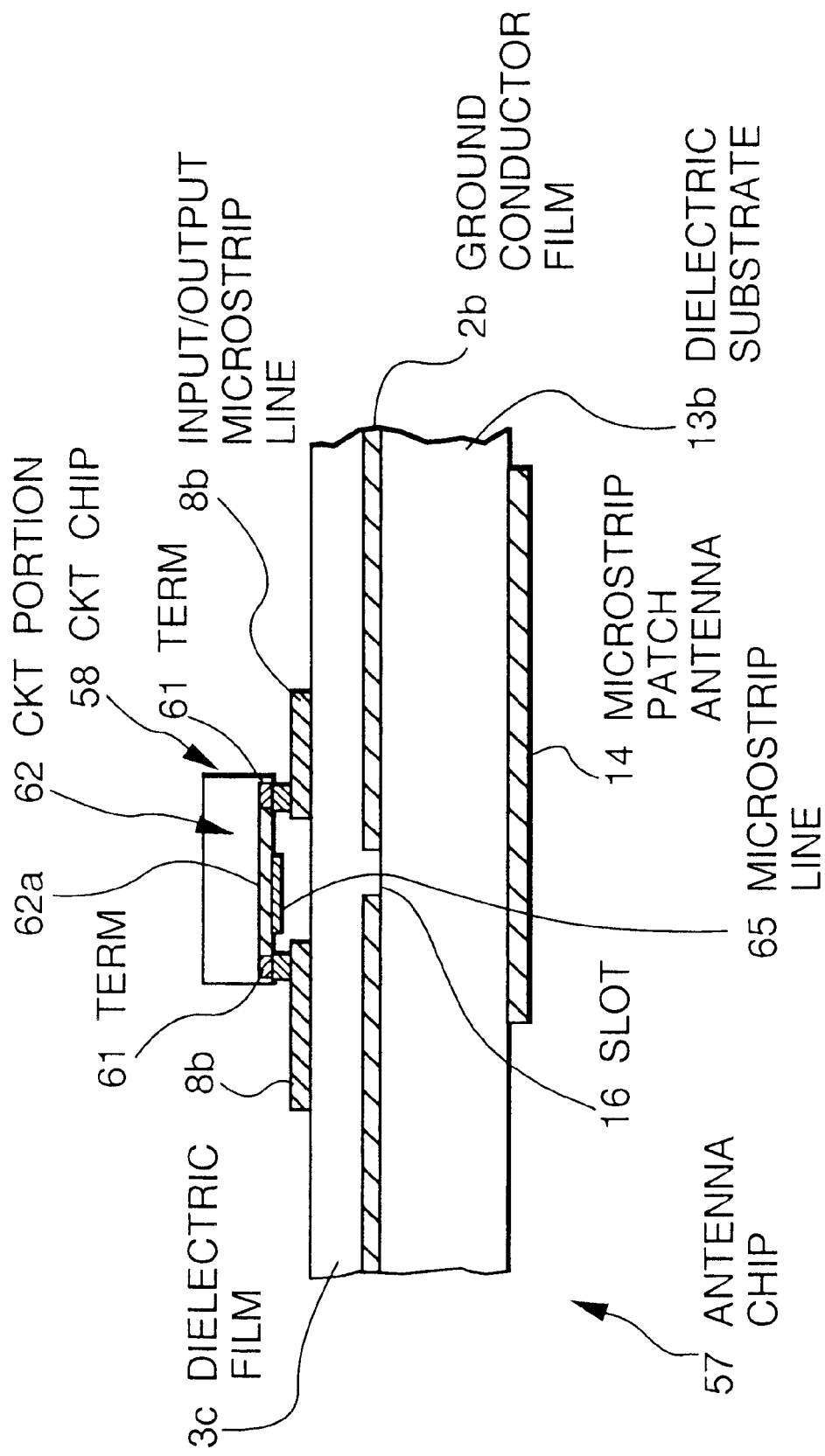
FIG. 7 is a cross-sectional view of a fifth embodiment of an antenna apparatus.

A fifth embodiment will be described. FIG. 7 is a cross-sectional view of the fifth embodiment of an antenna apparatus.

In FIG. 7, the structure of the fifth embodiment is similar to that of the fourth embodiment. The difference is in that an antenna chip 57 is provided in place of the antenna chip 56 and a circuit chip 58 in place of the circuit chip 52. The antenna chip 57 comprises a dielectric substrate 13b, a ground conductor film 2b, having a slot 16, on the dielectric substrate 13b, a dielectric film 3c, and input/output microstrip lines 8a on the dielectric film 3c. The circuit chip 58 has a microstrip line 65 thereon which is connected to an input terminal 61 of the circuit portion 62. The input/output microstrip line 8b is connected to an output terminal of the circuit portion 62. The circuit chip 58 is arranged such that the microstrip line 65 is coupled to the microstrip patch antenna 14 through the dielectric film 3c, the slot 16, the dielectric substrate 13b, and a space between the microstrip line 65 and the top surface of the antenna chip 57.

Radiowaves received by the microstrip patch antenna 14 is supplied to the detecting circuit in the circuit chip 58 through the dielectric substrate 13b, the slot 16, the dielectric film 13b, and the space between the microstrip line 65 and the top surface of the antenna chip 57.

The detection output signal of the detection circuit is outputted by the input/output microstrip line 8b.

This structure of the fifth embodiment eliminates a loss in the microstrip line 7 and the bump 6b in former embodiments and thus, a high sensitivity is provided.

Figure 8:
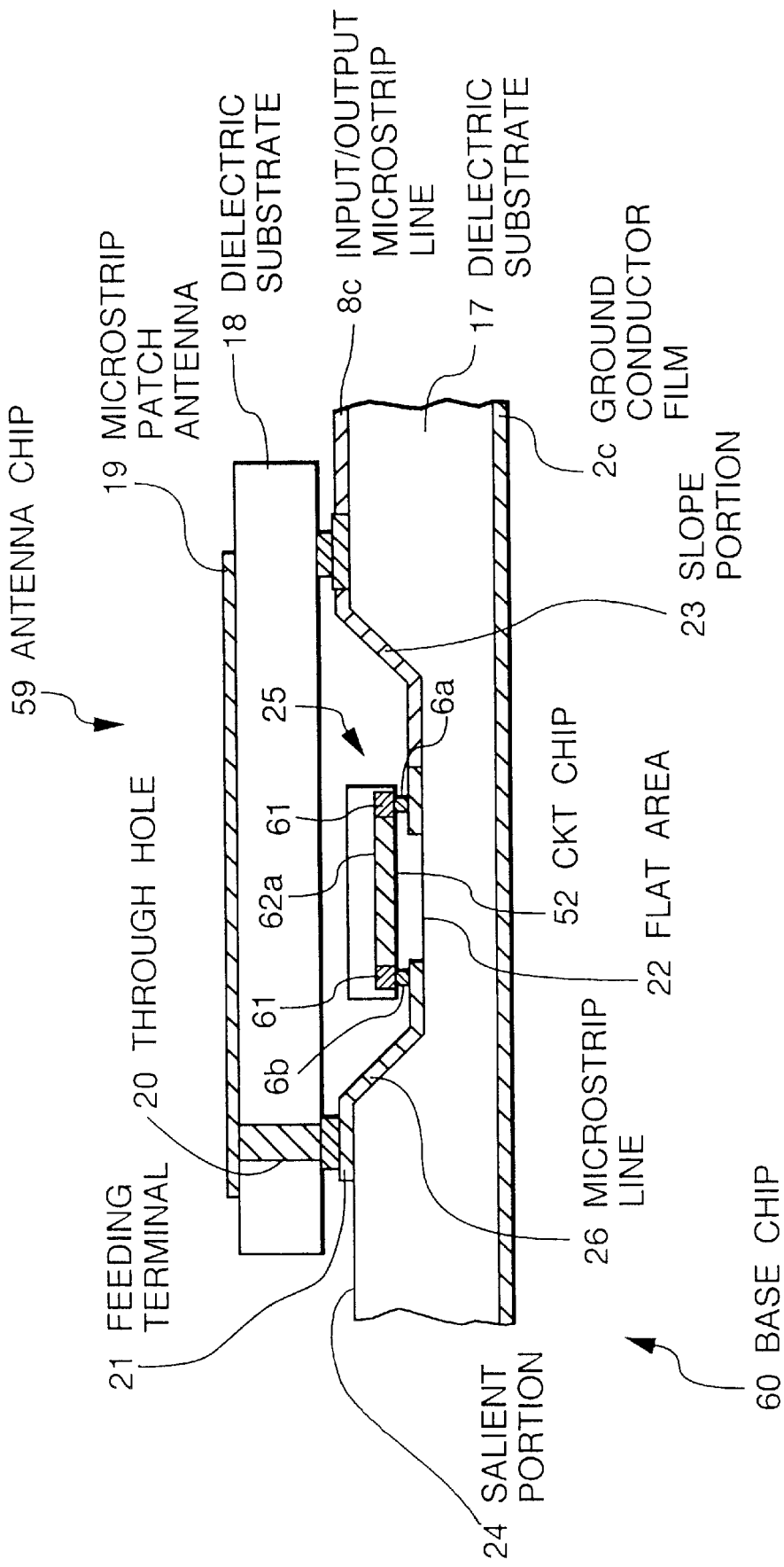
FIG. 8 is a cross-sectional view of a sixth embodiment of an antenna apparatus.
Figure 9:
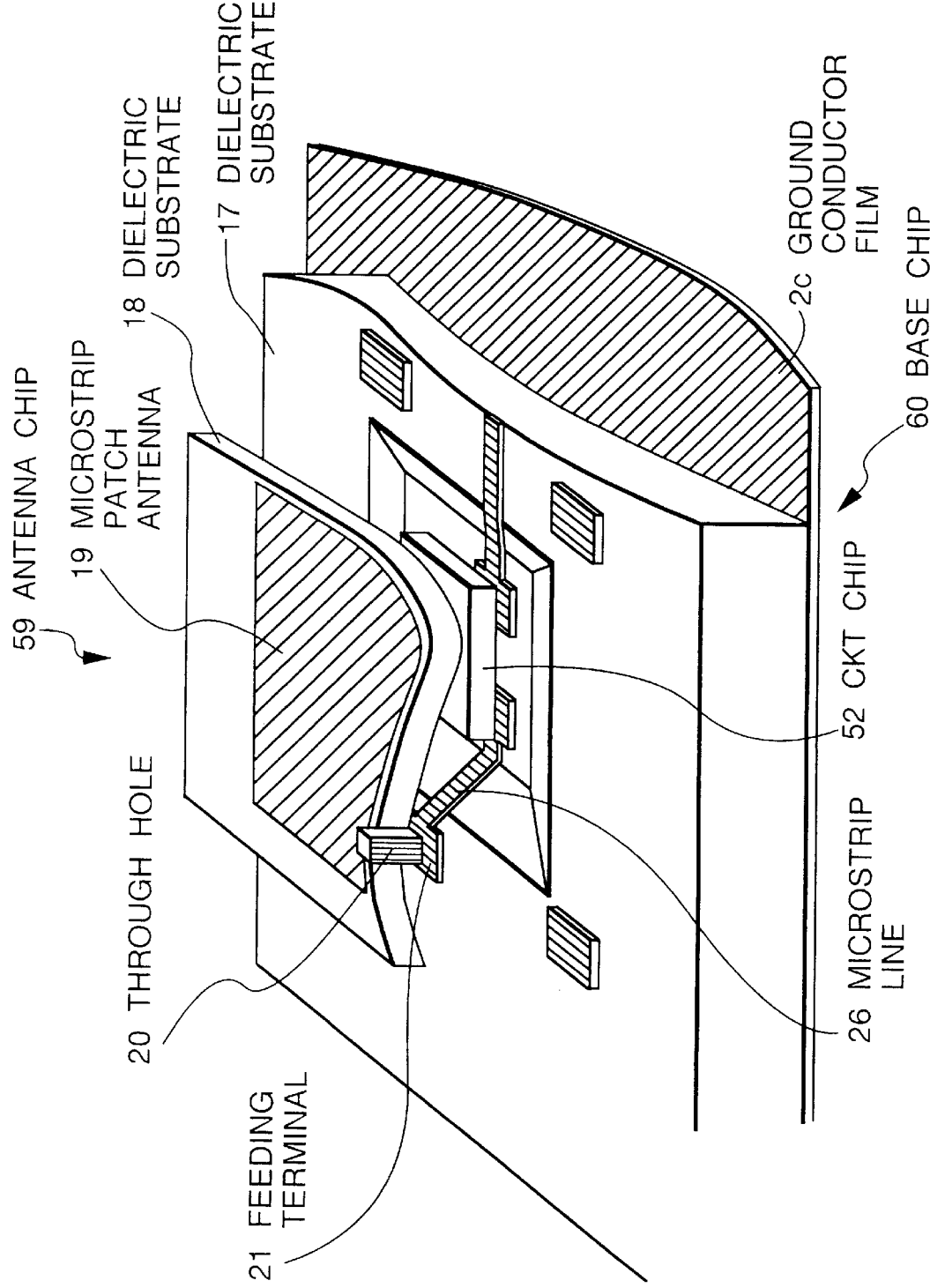
FIG. 9 is a perspective view of the sixth embodiment of the antenna apparatus.

A six embodiment will be described. FIG. 8 is a cross-sectional view of the sixth embodiment of an antenna apparatus. FIG. 9 is a perspective view of the sixth embodiment of the antenna apparatus.

In FIGS. 8 and 9, the antenna apparatus of the sixth embodiment comprises a base chip 60, a circuit chip 52, and an antenna chip 59. The base chip 60 comprises a ground conductor film 2c, a dielectric substrate 17 having a salient portion 24, a hollow portion 25 having a flat area 22 and a slope portion 23 on the top surface side of the dielectric substrate 17, a microstrip line 26 formed on the salient portion 24, the slope 23, and the flat area 22 as best seen in FIG. 8. The antenna chip 59 comprises a dielectric substrate 18 having a through hole 20, a microstrip patch antenna 19 on a top surface of the dielectric substrate 18, and a feeding terminal 21 on the bottom surface of the dielectric substrate 18, the through hole 20 connecting the microstrip patch antenna 19 and the feeding terminal 21. The feeding terminal 21 is connected to the microstrip line 25 on the salient portion 24 and the circuit portion 62 in the circuit chip 52 is connected to the microstrip line 26 at the flat area 22 through the bump 6b as best seen in FIG. 8. Therefore, the microstrip patch antenna 19 is connected to the circuit portion 62 through the through hole 20, the feeding terminal 21, the microstrip line 26, the bump 6b. The antenna chip 59 is mounted on the base chip 60 such that the hollow portion is covered by the antenna chip 59.

This structure provides a miniaturization because the second semiconductor substrate 5 are arranged under the microstrip patch antenna 19. Moreover, because the bottom surface of the base chip 60 is the ground conductor film 2c, it is easy to mount this antenna apparatus on other substrate. Further, the microstrip patch antenna 19 acts as a portion of a package for protecting the circuit chip 52.

In this embodiment, instead of the third and fourth dielectric substrates 17 and 18, a silicon substrate or a glass plate on which dielectric films may be laminated to form the hollow portion 25 by varying a thickness of the laminated dielectric films.

In the above-mentioned embodiments, the GaAs substrate is used for the circuit chips 52 and 58. However, the circuit chip 52 or 58 may be formed by a silicon substrate or a InP substrate and an active circuit formed on the silicon substrate or the InP substrate.

Figure 10:
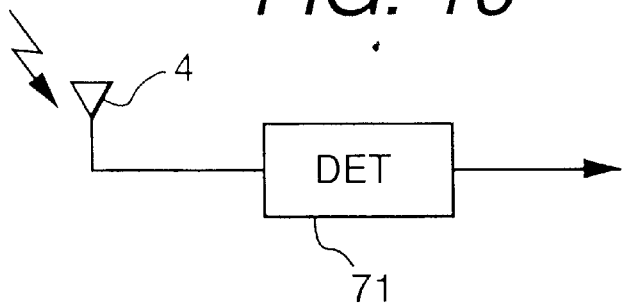
FIG. 10 is a block diagram of all embodiments showing a detection circuit.
Figure 11:
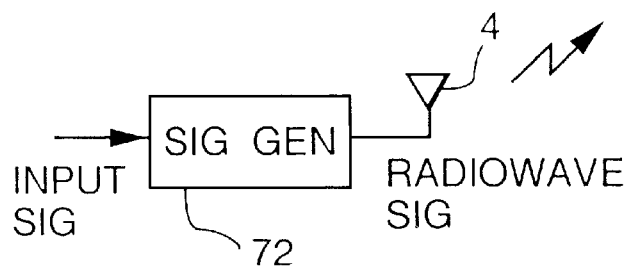
FIG. 11 is a block diagram of all embodiments showing a signal generation circuit.
Figure 12:
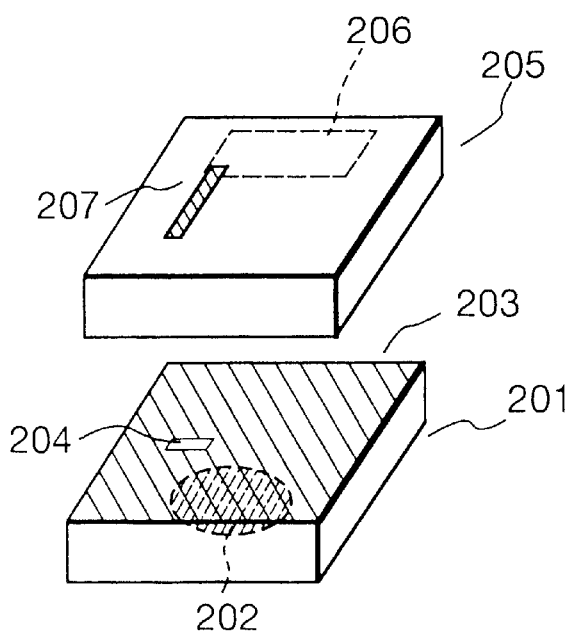
FIG. 12 is a perspective view of a prior art monolithic antenna apparatus.

In the above-mentioned embodiments, the circuit portion 62 includes at least an active circuit for receiving or transmitting a radiowave signal. FIG. 10 is a block diagram of all embodiments showing a detection circuit. The detection circuit 71 detects a radio signal from radiowaves received by the microstrip patch antenna 4 and supplies a radio signal through the input/output microstrip line. FIG. 11 is a block diagram of all embodiments showing a signal generation circuit. The signal generation circuit 72 generates a radiowave signal from an input signal from the input/output microstrip line and supplies it to the microstrip patch antenna 4.

In these embodiments, the dielectric film comprises a silicon dioxide ($SiO_2$) film, a silicon Nitride ($Si_3N_4$) film, or a polymide film. The circuit chip 52 comprises a GaAs substrate and the circuit portion 62 comprises MESFETs (metal-semiconductor filed-effect transistor, HBTs, or HEMTs (high electron mobility transistor), or a Schottky barrier diode.

In these embodiments, one active circuit, i.e., the detecting circuit, is formed. However, it is also possible to form a multi-chip module as the circuit chip 52 or 58 including a digital signal processing circuit, mounted on the circuit chip 52 or 58, for processing the detected signal, in addition of the detecting circuit.

Figure 13:
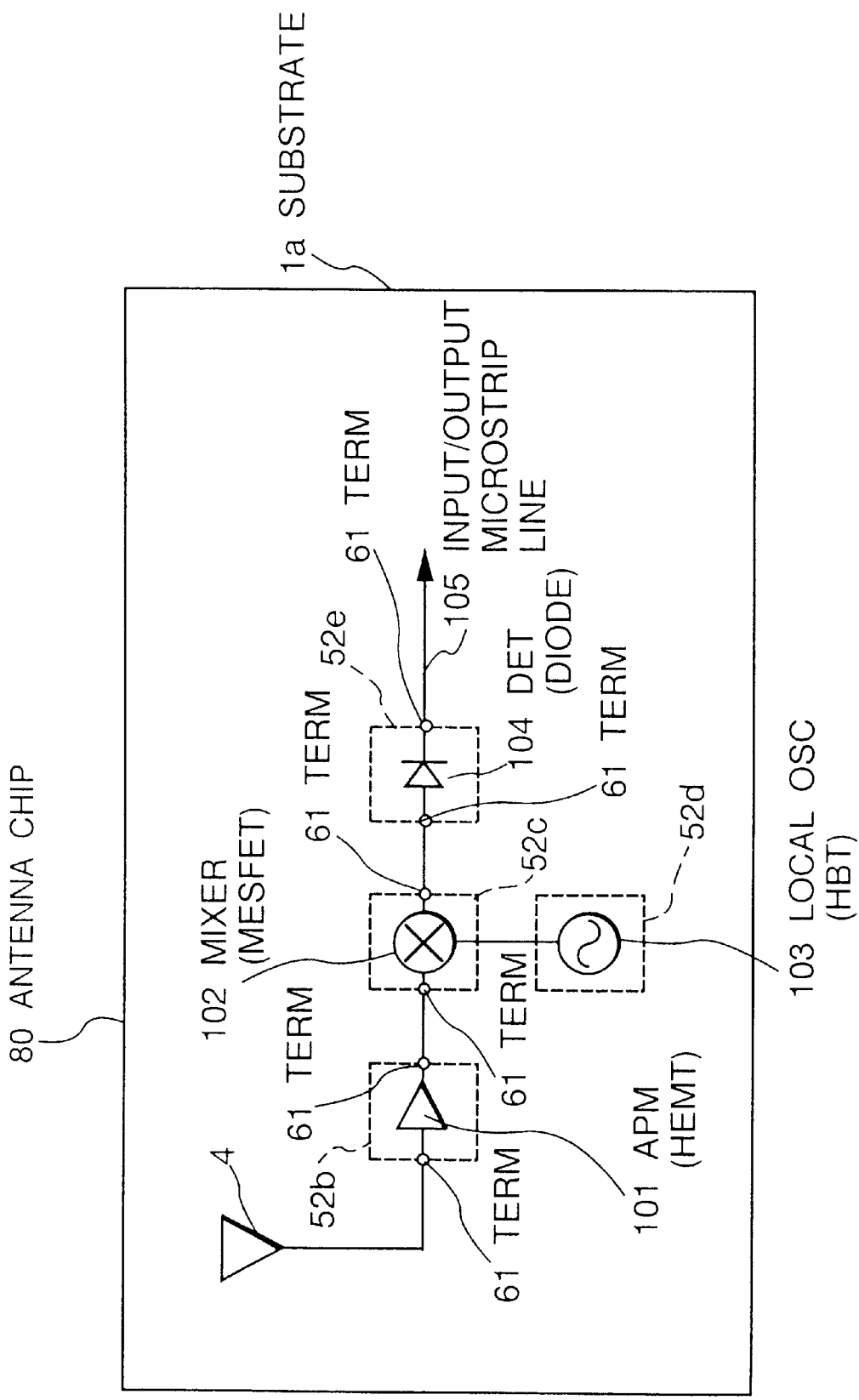
FIG. 13 is a block diagram of this invention showing an example of a circuit arrangement including a plurality of active circuits.

In all embodiments, a plurality of sets of the microstrip patch antennas and the active circuits can be provided as an antenna array apparatus. FIG. 13 is a block diagram of this invention showing an example of a circuit arrangement including a plurality of active circuits.

In FIG. 13, an antenna chip 80 comprising the substrate 1a, the microstrip patch antenna 4 on the substrate 1a, and interconnection microstrip lines. A low noise amplifier 101 comprising HEMTs (high electron mobility transistors) is formed on a circuit chip 52b for receiving a radio wave signal from the microstrip patch antenna 4. An output of the low noise amplifier 101 is supplied to a mixer 102 comprising a MESFET (metal-semiconductor filed-effect transistor) formed on a circuit chip 52c. On the other hand, a local oscillator 103 comprising a HBT (hetero junction bipolar transistor) formed on a circuit chip 52d supplies a local oscillation signal to the mixer 102. The mixer 102 mixes the local oscillation signal with the output of the low noise amplifier 101. An output of the mixer 101 is supplied to a detection circuit comprising a diode 104 formed on a circuit chip 52e. These circuit chips 52b to 52e are fixed on the antenna chip 80 by the flip-chip bonding and are provided with electrical interconnection by the interconnection microstrip lines. In this example of this invention, it is easy to form a hybrid circuit including the active circuits having different kind of transistors or diodes or the like on the antenna chip 80 including the microstrip patch antenna 4 by the flip-chip bonding. That is, a plurality of circuit chips 52b to 52e are fixed to the antenna chip 80 by providing mechanical and electrical connections between the microstrip patch antenna 4 and the active circuit (amplifier 101, mixer 102, the local oscillator 103, or the detector 104) of at least one of the plurality of circuit chips, mechanical and electrical connections between the active circuits of the plurality of circuit chips, and a mechanical and electrical connection between at least one of the plurality of circuit chips and the input/output microstrip line 105 through the bumps, wherein the active circuits of the plurality of circuit chips comprise semiconductor elements having at least two different kinds of semiconductor structures (HEMT, MESFET, HBT, or the like).

As mentioned above, the active circuit, namely, the detection circuit or the like and the passive circuits, namely, the base chip or the antenna chip are formed through different processings and these are combined by the flip-chip bonding. Therefore, a high sensitive antenna apparatus is provided with a relative small chip area.

What is claimed is:

1. An antenna apparatus comprising:
   a first chip having: a substrate; a ground film on said substrate; a dielectric film on said ground film; a micro-patch antenna on said dielectric film; an interconnection microstrip line, on said dielectric film, coupled to and extending from said micro-patch antenna; and an input/output microstrip line on said dielectric film at a predetermined position;
   a second chip having a circuit portion therein, including input and output terminals on a surface of the second chip, for effecting a predetermined operation with said micro-patch antenna; and
   connecting means, including bumps, for fixing said second chip to said first chip by providing mechanical and electrical connection between said circuit portion and said interconnection microstrip line and between said circuit portion and said input/output microstrip line through said input and output terminals and said bumps.

2. An antenna apparatus as claimed in claim 1, wherein said substrate comprises a silicon substrate.

3. An antenna apparatus as claimed in claim 1, wherein said substrate comprises a GaAs substrate.

4. An antenna apparatus as claimed in claim 1, wherein said substrate comprises a dielectric substrate.

5. An antenna apparatus as claimed in claim 1, wherein said second chip further comprises a GaAs substrate.

6. An antenna apparatus as claimed in claim 1, wherein said circuit portion comprises a detection circuit for detecting, a radio signal from radiowaves received by said microstrip patch antenna.

7. An antenna apparatus as claimed in claim 1, wherein said circuit portion comprises a radiowave signal generation circuit for generating a radiowave signal from an input signal supplied through said input/output microstrip line.

8. An antenna apparatus comprising:
   a first chip having: a substrate; a ground film on said substrate; a dielectric film on said ground film; an interconnection microstrip line on said dielectric film at a first predetermined position; and an input/output microstrip line on said dielectric film at a second predetermined position;
   a second chip having: a dielectric substrate having a through. hole; a micro-patch antenna on a first surface of said dielectric substrate; and a feeding terminal on a second surface of said. dielectric substrate, said first surface being opposite to said. second surface, said through hole electrically connecting said. micro-patch antenna to said feeding terminal;
   first connecting means, having a first bump, for fixing said second chip to said first chip by providing a first mechanical and electrical connection between said feeding terminal and said interconnection microstrip line through said first bump; and
   a third chip having a circuit portion therein, including input. and output terminals on a surface of the second chip, for effecting a predetermined operation with said micro-patch antenna; and
   second connecting means, having second bumps, for fixing said third chip to said first chip by providing second mechanical and electrical connections between said circuit portion and said interconnection microstrip line and between said circuit portion and said input/output microstrip line through said input and output: terminals and said second bumps.

9. An antenna apparatus as claimed in claim 8, wherein said. substrate comprises a silicon substrate.

10. An antenna apparatus as claimed in claim 8, wherein said substrate comprises a GaAs substrate.

11. An antenna apparatus as claimed in claim 8, wherein said substrate comprises a dielectric substrate.

12. An antenna apparatus as claimed in claim 8, wherein said second chip further comprises a GaAs substrate.

13. An antenna apparatus as claimed in claim 8, wherein said circuit portion comprises a detection circuit for detecting a radio signal from radiowaves received by said microstrip patch antenna.

14. An antenna apparatus as claimed in claim 8, wherein said circuit portion comprises a radiowave signal generation circuit for generating a radiowave signal from an input signal supplied through said input/output microstrip line.

15. An antenna apparatus comprising:
a first chip having: a dielectric substrate having a salient portion and a hollow portion having a flat area and a slope portion connecting said salient portion to said flat area on a first surface of said dielectric substrate; a ground conductor film on a second surface of said dielectric substrate which is opposite to said first surface; a microstrip line, on said first surface, extending from said salient portion to said flat area via said slope portion; and an input/output strip line, on said first surface, extending from said salient portion to said flat area via said slope portion and electrically insulated from said microstrip line;
a second chip having: a second dielectric substrate having a through hole; a micro-patch antenna on a first surface of said second dielectric substrate; and a feeding terminal on a second surface of said second dielectric substrate which is opposite to said first surface of said second dielectric substrate, said through hole electrically connecting said micro-patch antenna to said feeding terminal;
first connecting means, having a first bump for fixing said second chip to said first chip by providing first mechanical and electrical connection between said feeding terminal and said microstrip line on said salient portion through said first bump;
a third chip, arranged in said hollow portion, having: a circuit portion therein for effecting a predetermined operation with said micro-patch antenna; and first and second terminals on a surface of said third chip; and
second connecting means, having second bumps, for fixing said third chip to said first chip by providing second mechanical and electrical connections between said circuit portion and said microstrip line and between said circuit portion and said input/output microstrip line through said second bumps.

16. An antenna apparatus as claimed in claim 15, wherein. said circuit portion comprises a radiowave signal generation circuit for generating a radiowave signal from an input signal supplied through said input/output microstrip line.

17. An antenna apparatus as claimed in claim 15, wherein said circuit portion comprises a detection circuit for detecting a radio signal from radiowaves received by said microstrip patch antenna.

18. An antenna apparatus as claimed in claim 15, wherein said second chip further comprises a GaAs substrate.

19. An antenna apparatus comprising:
a first chip having: a dielectric substrate; a ground conductor film on a first surface of said substrate having a slot; a dielectric film on said ground conductor film, said dielectric film being connected to said dielectric substrate through said slot; a microstrip line on said dielectric film at a first predetermined position; an input/output microstrip line on said dielectric film at a second predetermined position; and a micro-patch antenna on a second surface of said dielectric substrate which is opposite to said first surface;
a second chip having a circuit portion therein, including input and output terminals on a surface of the second chip, for effecting a predetermined operation with said micro-patch antenna; and
connecting means, having bumps, for fixing said second chip to said first chip by providing mechanical and electrical connections between said circuit portion and said interconnection microstrip line and between said circuit portion and said input/output microstrip line through said input and output terminals and said bumps, wherein said micro-patch antenna, said slot, and said microstrip line are arranged such that said micro-patch antenna and said microstrip line are electromagnetically coupled through said slot;
wherein radiowaves received by said micro-patch antenna are directly coupled to said microstrip line through said slot.

20. An antenna apparatus as claimed in claim 19, wherein said second chip further comprises a GaAs substrate.

21. An antenna apparatus as claimed in claim 19, wherein said circuit portion comprises a detection circuit for detecting a radio signal from radiowaves received by said microstrip patch antenna.

22. An antenna apparatus as claimed in claim 19, wherein said circuit portion comprises a radiowave signal generation circuit for generating a radiowave signal from an input signal supplied through said input/output microstrip line.

23. An antenna apparatus comprising:
a first chip having: a dielectric substrate; a ground conductor film on a first surface of said substrate having a slot; a dielectric film on said ground conductor film, said dielectric film being connected to said dielectric substrate through said slot; an input/output microstrip line on said dielectric film at a predetermined position; and a micro-patch antenna on a second surface of said dielectric substrate which is opposite to said first surface;
a second chip having a circuit portion therein, including a terminal and a microstrip line on a surface of said second chip connected to said circuit, for effecting a predetermined operation with said micro-patch antenna; and
connecting means, having bumps, for fixing said second chip to said first chip by providing a connection between said circuit portion and said input/output microstrip line through said terminal and said bumps, wherein said micro-patch antenna, said slot, and said microstrip line are arranged such that said micro-patch antenna and said microstrip line are electromagnetically coupled through said slot;
wherein radiowaves received by said micro-patch antenna are directly coupled to said microstrip line through said slot.

24. An antenna apparatus as claimed in claim 23, wherein said second chip further comprises a GaAs substrate.

25. An antenna apparatus as claimed in claim 23, wherein said circuit portion comprises a detection circuit for detecting a radio signal from radiowaves received by said microstrip patch antenna.

26. An antenna apparatus as claimed in claim 23, wherein said circuit portion comprises a radiowave signal generation circuit for generating a radiowave signal from an input signal supplied through said input/output microstrip line.

27. An antenna apparatus comprising:

a first chip having: a substrate; a ground film on said substrate; a dielectric film on said ground film; a microstrip patch antenna on a first surface of said dielectric film; an input/output microstrip line on said first surface of said dielectric film at a predetermined position;

a plurality of second chips, each having: a respective dielectric substrate; and a respective active circuit for effecting a predetermined operation; and respective connecting means, having corresponding bumps, for fixing said plurality of second chips to said first chip by providing mechanical and electrical connections between said microstrip patch antenna and said active circuit of at least one of said plurality of second chips, mechanical and electrical connections between said active circuits of said plurality of second chips, and a mechanical and electrical connection between at least one of said plurality of second chips and said input/output microstrip line through said bumps, wherein said active circuits of said plurality of second chips comprise at least two different kinds of semiconductor structures.

* * * * *

UNITED STATES PATENT AND TRADEMARK OFFICE
CERTIFICATE OF CORRECTION

PATENT NO. : 5,903,239
DATED       : May 11, 1999
INVENTOR(S) : Takahashi et al.

It is certified that error appears in the above-indentified patent and that said Letters Patent is hereby corrected as shown below:

On the title page, item [54] and column 1, line 2, delete "CIRCUITS" and insert --CIRCUIT--.

Signed and Sealed this

Twenty-third Day of November, 1999

Attest:

Q. TODD DICKINSON

Attesting Officer

Acting Commissioner of Patents and Trademarks